United States Patent
Heo et al.

(10) Patent No.: US 7,956,773 B2
(45) Date of Patent: Jun. 7, 2011

(54) METHOD OF DRIVING BIT STREAM PROCESSOR

(75) Inventors: Se-Wan Heo, Busan (KR); Seong-Won Lee, Gyeonggi-do (KR); Jung-Hee Suk, Daejeon (KR); Tae-Moon Roh, Daejeon (KR); Jong-Dae Kim, Daejeon (KR)

(73) Assignees: Electronics and Telecommunications Research Institute, Daejeon (KR); Kwangwoon University Industry-Academic Collaboration Foundation, Seoul (KR)

( * ) Notice: Subject to any disclaimer, the term of this patent is extended or adjusted under 35 U.S.C. 154(b) by 36 days.

(21) Appl. No.: 12/481,748

(22) Filed: Jun. 10, 2009

(65) Prior Publication Data

US 2010/0156680 A1    Jun. 24, 2010

(30) Foreign Application Priority Data

Dec. 23, 2008 (KR) ................. 10-2008-0131863

(51) Int. Cl.
*H03M 7/30* (2006.01)

(52) U.S. Cl. .......................... 341/67; 341/65

(58) Field of Classification Search ............ 341/65, 341/67
See application file for complete search history.

(56) References Cited

U.S. PATENT DOCUMENTS

| 4,899,149 | A  | * | 2/1990 | Kahan ............. 341/67 |
| 5,181,031 | A  | * | 1/1993 | Tong et al. ........ 341/65 |
| 5,208,593 | A  | * | 5/1993 | Tong et al. ........ 341/65 |
| 5,903,674 | A  |   | 5/1999 | Ooi |
| 6,507,293 | B2 | * | 1/2003 | Deeley et al. ...... 341/67 |
| 6,563,440 | B1 | * | 5/2003 | Kangas ............ 341/65 |
| 2006/0202874 | A1 | * | 9/2006 | Watanabe et al. ... 341/67 |

FOREIGN PATENT DOCUMENTS

| JP | 2008-124600 A | 5/2008 |
| KR | 1998-0032138 A | 7/1998 |
| KR | 1998-0032156 A | 7/1998 |
| KR | 1020020017825 A | 3/2002 |

* cited by examiner

*Primary Examiner* — Howard Williams
(74) *Attorney, Agent, or Firm* — Ladas & Parry LLP

(57) ABSTRACT

Provided is a bit stream processor using a reduced table lookup. The bit stream processor includes a bit stream exclusive register in a general purpose register in order to process data of a variable length effectively. Additionally, the bit stream processor an instruction of a table lookup method to which a prefix method is applied and a bit stream exclusive instruction in order to reduce an entire memory size.

6 Claims, 5 Drawing Sheets

METHOD OF DRIVING BIT STREAM PROCESSOR

CROSS-REFERENCE TO RELATED APPLICATIONS

This U.S. non-provisional patent application claims priority under 35 U.S.C. §119 of Korean Patent Application No. 10-2008-0131863, filed on Dec. 23, 2008, the entire contents of which are hereby incorporated by reference.

BACKGROUND OF THE INVENTION

The present invention disclosed herein relates to a bit stream processor, and more particularly, to a bit stream processor using a reduced table lookup.

An exclusive hardware or a general purpose embedded processor is used for bit stream coding such as a variable length code (VLC) or context-adaptive binary arithmetic coding (CABAC). The exclusive hardware is optimized for one standard format. Therefore, the exclusive hardware is not capable of processing various standard formats and the general purpose embedded processor is designed suitable for processing a fixed bit. That is, a general processor requires several registers for combining or dividing codes, or storing a position of the VLC when there is bit stream coding for processing variable length data. Therefore, the general processor becomes inefficient since several steps of instructions are required for bit stream coding. Additionally, the general processor uses a table lookup method for conversion between a VLC and a fixed length code. However, a table size is increased when an entropy code of a variable length is used in the table lookup method.

SUMMARY OF THE INVENTION

The present invention provides a reduced table lookup while bit stream is coded or decoded.

The present invention also provides a table lookup instruction using a reduced table lookup.

Embodiments of the present invention provide methods of operating a bit stream processor that processes a bit stream through a table lookup include: counting the number of 0s or 1s in the first data part; and combining the counted result with the second data part. The bit stream includes a first data part and a second data part.

BRIEF DESCRIPTION OF THE FIGURES

The accompanying figures are included to provide a further understanding of the present invention, and are incorporated in and constitute a part of this specification. The drawings illustrate exemplary embodiments of the present invention and, together with the description, serve to explain principles of the present invention. In the figures.

DETAILED DESCRIPTION OF PREFERRED EMBODIMENTS

Hereinafter, exemplary embodiments of the present invention will be described in detail with reference to the accompanying drawings.

Figure 1:
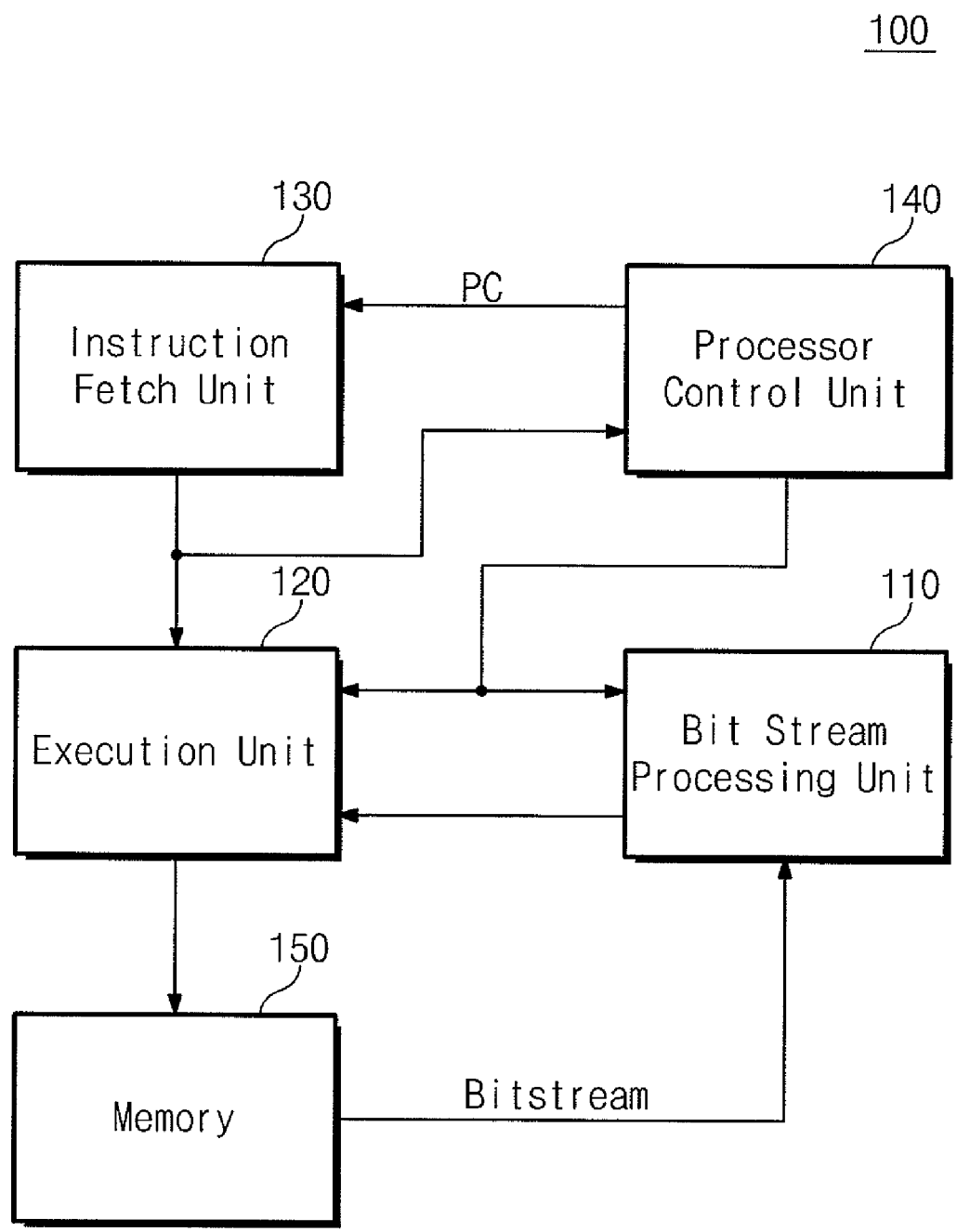
FIG. 1 is a block diagram illustrating a bit stream processor according to an embodiment of the present invention.

FIG. 1 is a block diagram illustrating a bit stream processor according to an embodiment of the present invention.

Referring to FIG. 1, a bit stream processor 100 includes a bit stream processing unit 110, an execution unit 120, an instruction fetch unit 130, a processor controlling unit 140, and a memory 150.

The bit stream processing unit 110 reads a bit stream from the memory 150. The bit stream processing unit 110 converts the read bit stream into another bit stream based on a reduced table lookup. A method of converting a bit stream based on a reduced table lookup will be described with FIGS. 4 and 5.

The execution unit 120 converts the bit stream based on a table lookup. The bit stream was previously converted based on the reduced table lookup in the bit stream processing unit 110. The execution unit 120 generates an address to access the memory 150 with reference to the converted result. The instruction fetch unit 130 fetches an instruction related to a bit stream according to a program counter PC of the processor controlling unit 140. The processor controlling unit 140 controls the bit stream processing unit 110 and the execution unit 120.

The memory 150 stores bit stream data. The memory 150 is a dynamic random access memory (DRAM). Additionally, the memory 150 may be a static random access memory (SRAM) or a non-volatile memory.

The bit stream processing unit 110 will be described in more detail with reference to FIG. 2. Additionally, a method of generating a bit stream based on the reduced table lookup of the bit stream processing unit 110 will be described in more detail with reference to FIGS. 3 through 5.

The bit stream processor 100 processes a bit stream having a variable length code (VLC). Types of bit streams include H.264, MPEG1, MPEG2, and MPEG4.

The bit stream processor 100 uses an exclusive bit stream register and an instruction of a table lookup method in order to process a continuous bit stream, such that data with a variable length are efficiently processed.

Figure 2:
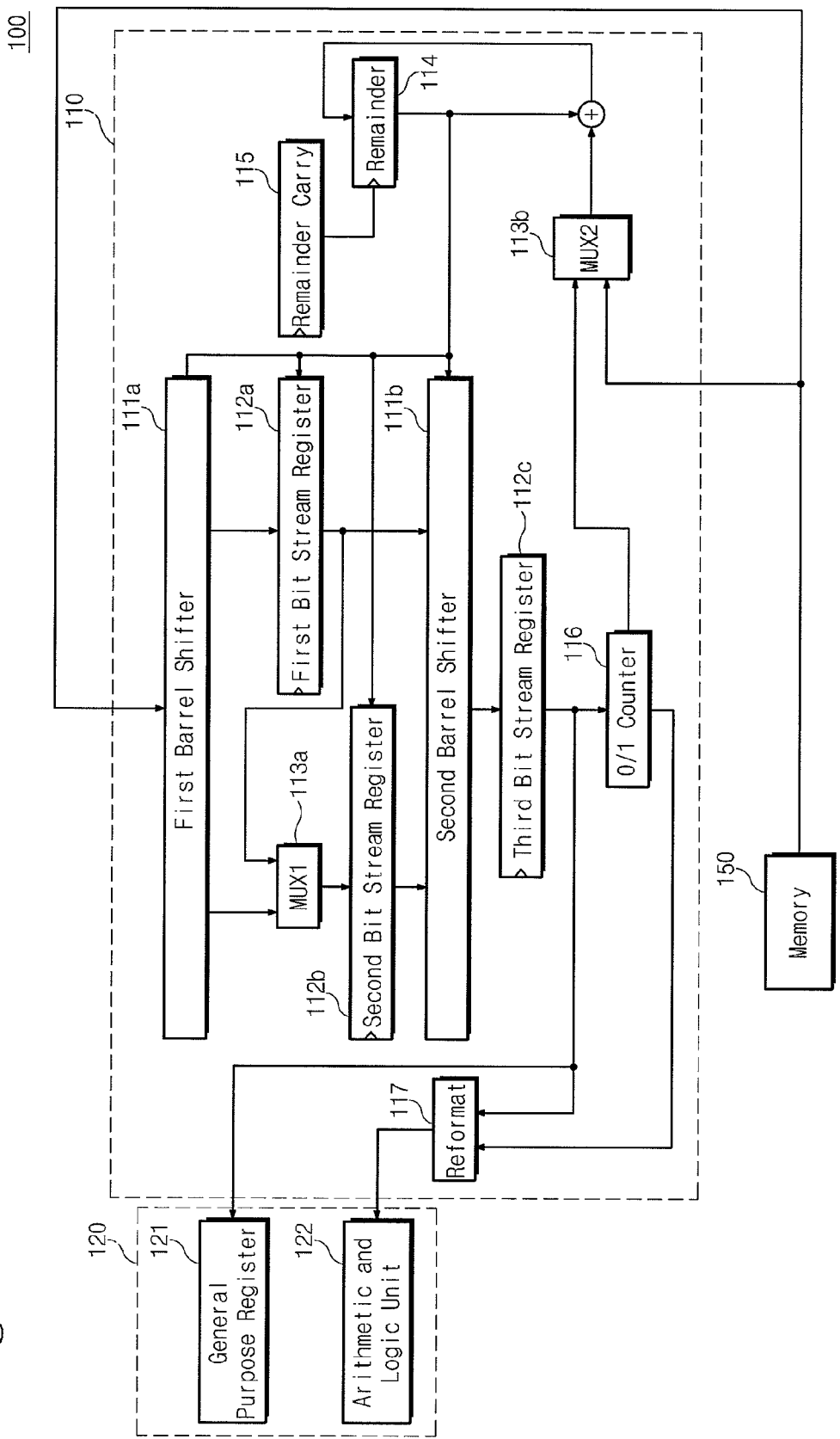
FIG. 2 is a block diagram illustrating a detailed bit stream processing unit 110 of FIG. 1.

FIG. 2 is a block diagram illustrating a detailed bit stream processing unit 100 of FIG. 1.

Referring to FIGS. 1 and 2, the bit stream processor 100 includes first and second barrel shifters 111$a$ and 111$b$, first to third bit stream registers 112$a$, 112$b$, and 112$c$. first and second multiplexers 113$a$ and 113$b$, a remainder 114, a remainder carry (RC) 115, a 0/1 counter 116, and a reformat 117.

The first and second barrel shifters 111$a$ and 111$b$ process data by 64-bit unit. The first barrel shifter 111$a$ receives a bit stream from the memory 150 and shifts it according to a control of the remainder 114. Then, the first barrier shifter 111$a$ outputs the shifted bit stream to the first multiplexer 113$a$ and the first bit stream register 112$a$.

The first bit stream register 112$a$ stores the bit stream of 32 bits that will be used later on. The second bit stream register 112$b$ stores the bit stream of 32 bits that is currently used. The third bit stream register 112$c$ stores the bit stream of 32 bits that the bit stream processor 100 uses.

The remainder 114 has 7 bits representing a position of a bit that the second bit stream uses. Additionally, the remainder 114 becomes a shift amount of the first and second barrel shifters 111$a$ and 111$b$. if a value of the remainder 114 is more than 32, all bit stream of the second bit stream register 112$b$ is used and a bit stream of the first bit stream register 112a is used. In this case, the remainder carry 115 becomes 1.

Additionally, a bit stream of a new 32 bit unit is inputted, the remainder carry 115 is cleared as 1, and data of the second bit stream register 112b are replaced with data of the first bit stream register 112a. The remainder 114 has a value that is acquired by subtracting 32 from a currently stored value. Therefore, the remainder 114 represents a position of bit that the second bit stream register 112b uses.

The second barrel shifter 111b receives the bit stream from the first and second bit stream registers 112a and 112b and shifts it according to a control of the remainder 114. Then the second barrier shifter 111b stores the shifted bit stream in the third bit stream register 112c. The bit stream of the third bit stream register 112c is stored in the 31th register of a general purpose register 121 as a part of an unconverted bit stream.

The reformat 117 executes reversing bit ordering of the bit stream. A specific block diagram and operations of the reformat will be described with reference to FIG. 4.

The processing of the bit stream in FIG. 2 is realized through a bit stream instruction. The bit stream instruction will be described in more detail with reference to FIGS. 4 and 5.

Figure 3:
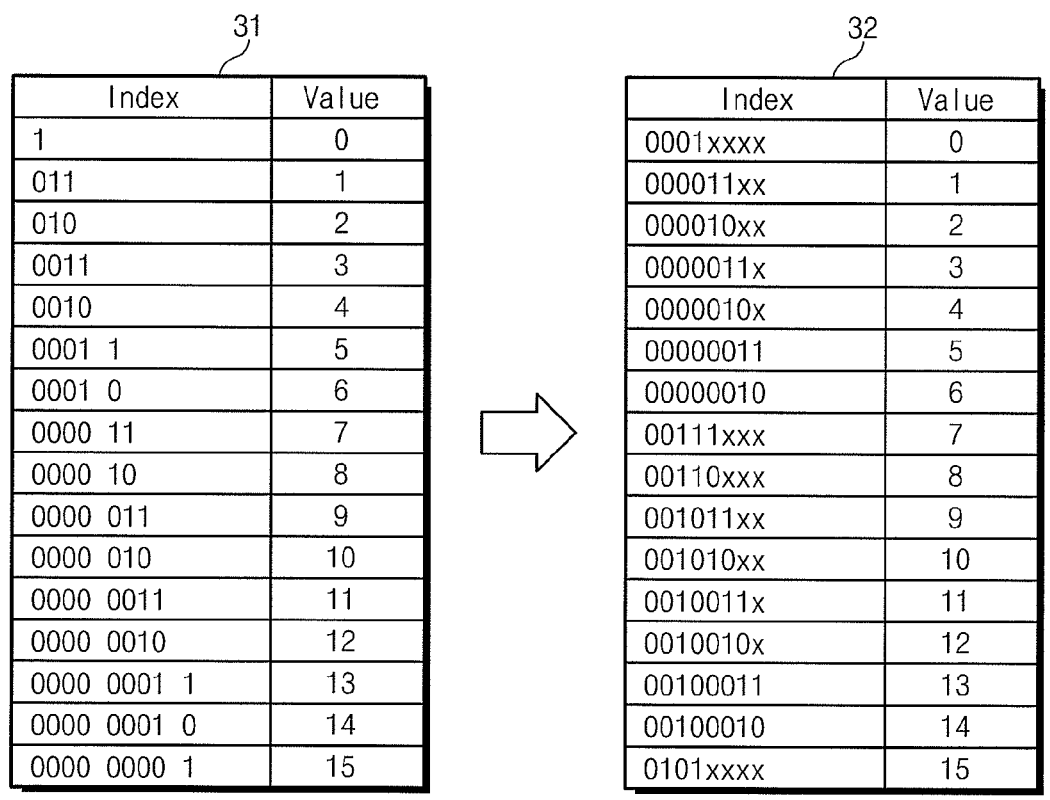
FIG. 3 is a table illustrating a table lookup according to an embodiment of the present invention.

FIG. 3 is a table illustrating a table lookup according to an embodiment of the present invention.

Referring to FIG. 3, a general table lookup 31 is converted to a table lookup 32 according to an embodiment of the present invention. The general table lookup 31 has a table whose size is increased if an entire VLC is used in a table lookup.

Accordingly, the table lookup 32 has a reduced table size.

That is, if the bit stream's leading 4 bits (or 8 bits) are 0, the table lookup 32 substitutes that with 001 (or, 010). The substituted value is used as a table prefix.

For example, if leading 4 bits of the bit stream are not 0s in the table lookup 32, 000 is added to the bit stream. If leading 4 bits of the bit stream are 0, the 4 bits of 0s are replaced with 001. If leading 8 bits of the bit stream are 0s, the 8 bits of 0s are replaced with 010. If not, when leading 12 bits of the bit stream are 0s, the 12 bits of 0s are replaced with 011. Additionally, although not illustrated, if leading 14 bits of a bit stream are 0s in the table lookup 32, the 14 bits of 0s are replaced with 100.

A method of constituting the table lookup 32 will be described in detail with reference to FIGS. 4 and 5.

The most important instruction among bit stream instructions is a table lookup instruction. The table lookup instruction obtains a data value from a VLC table using a portion of the bit stream and transmits it to the general purpose register 121 of FIG. 2.

According to a preferred embodiment of the present invention, a shift operation is performed by a code length in order to process a table lookup with a less cycle in a pipelined architecture.

The bit stream processor according to an embodiment of the present invention uses a table lookup instruction applied to a table lookup. The table lookup instruction includes a TLD instruction for executing encoding and a TLE instruction for executing decoding.

For example, it is assumed that TLD dr, sr, (imm1), imm2 are executed as a table lookup instruction. The table lookup instruction TLD determines the table index of FIG. 3 through a bit stream, and then stores a code value of the obtained table in the general purpose register 121 of FIG. 2. A variable Immediate of the table lookup instruction TLD includes a first variable imm1 and a second variable imm2.

The first variable Imm1 is a table prefix for 0s of more than 14 in a leading bit stream and also represents the maximum value of the prefix. The first variable Imm1 may be omitted in a general case. The second variable Imm2 is arbitrarily determined from 1 to 8, and determines how many bits are fetched from the bit stream to constitute an index of the table lookup. The table lookup instruction TLD according to an embodiment of the present invention is described in more detail with reference to FIG. 4.

Figure 4:
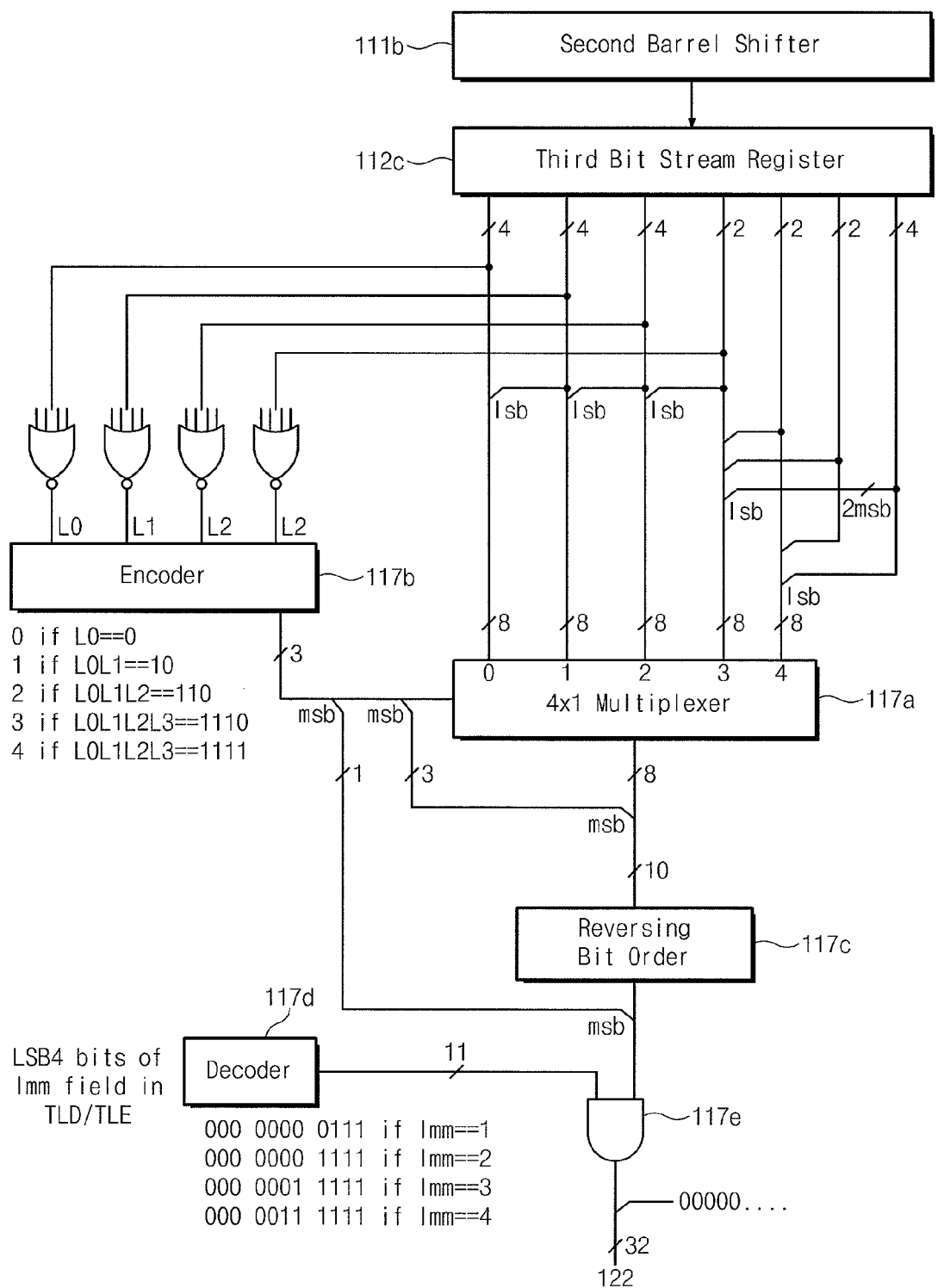
FIG. 4 is a block diagram illustrating an operation of a table lookup instruction according to an embodiment of the present invention.

FIG. 4 is a block diagram illustrating an operation of a table lookup instruction according to an embodiment of the present invention.

Referring to FIGS. 2 and 4, the reformat 117 includes a 4×1 multiplexer 117a, an encoder 117b, a reversing bit order 117c, a decoder 117d, and an AND gate 117e.

The encoder 117b counts how many bits are in the leading bit stream stored in the third bit stream register 112c, and then outputs its result to the reversing bit order 117c. The reversing bit order 117c reverses the order of 10 bits except for the most significant bit (MSB) in order to improve compression efficiency of the converted bit stream. The MSB, the data that changes the order of 10 bits, and the output of the decoder 117d are inputted into the AND gate 117e.

Figure 5:
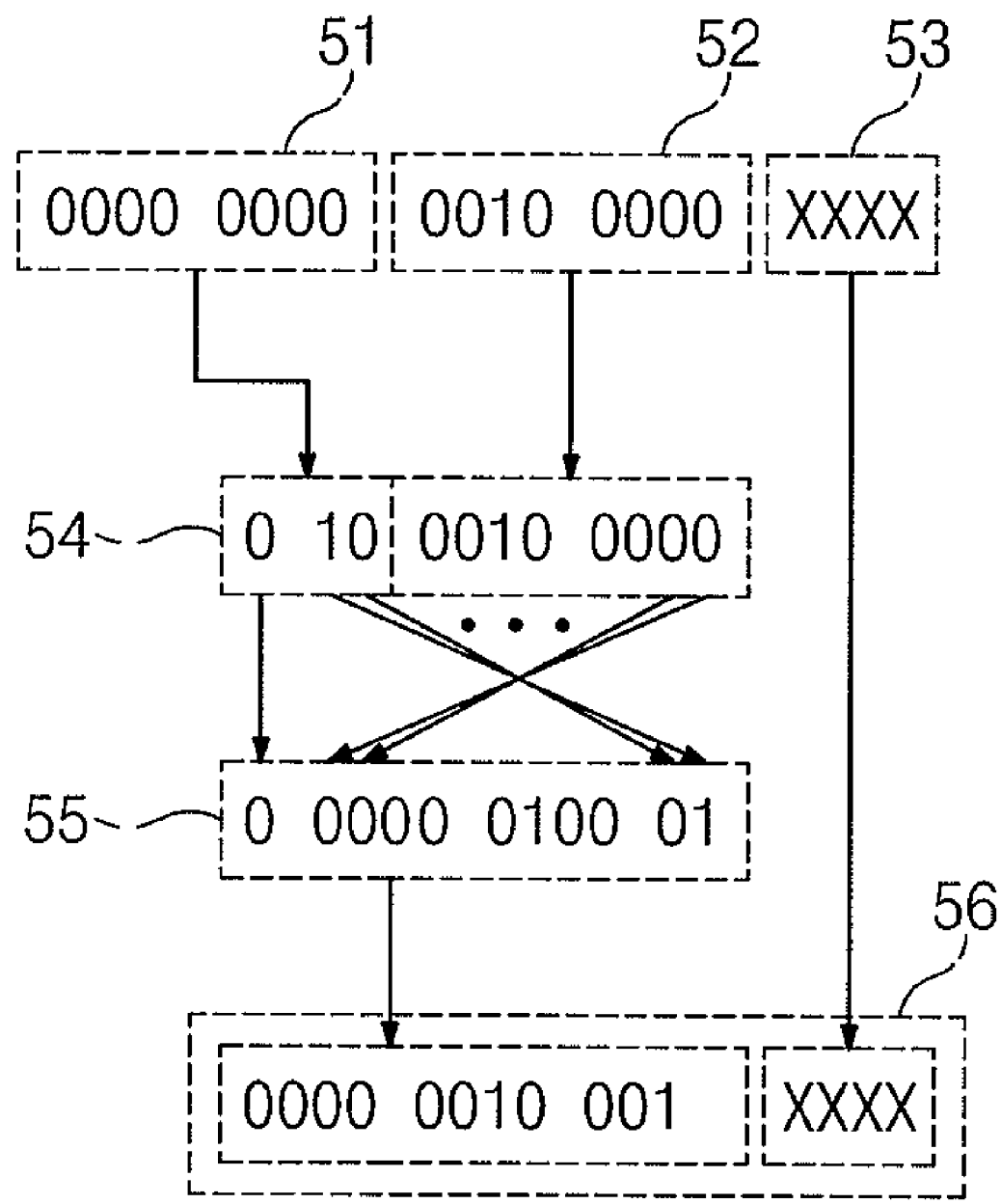
FIG. 5 is a block diagram illustrating generating of a reduced table lookup according to a table lookup instruction of FIG. 4.

FIG. 5 is a block diagram illustrating generating of a reduced table lookup according to a table lookup instruction of FIG. 4.

Referring to FIGS. 4 and 5, the bit stream processing unit 110 executes the table lookup command TLD. For example, it is assumed that TLD dr, sr, and 4 instructions are executed.

For example, the third bit stream register BS includes bit stream 0000 0000 0010 0000 XXXX. The bit stream 0000 0000 0010 0000 XXXX includes a first data part 51 of 8 bits, a second data part 52 of 8 bits, and third data part 53 of 4 bits. X represents "Don't care" bits. The third data part 53 is represented with 4 bits but more or less bits can be included therein.

The bit stream 0000 0000 0010 0000 XXXX is processed by 4 bits. The leading 8 bits in the bit stream 0000 0000 0010 0000 XXXX are 0s. The leading 8 bits are replaced with 010. That is, a portion corresponding to the leading 0s in the bit stream is replaced with a table prefix. Accordingly, the bit stream includes a first data part 54 of 3 bits, a second data part 52 of 8 bits, and a third data part 53 of 4 bits.

In the first data part 54 of 3 bits and the second data part 52 of 8 bits, the order of the remaining 10 bits is reversed except for the MSB. That is, the bit stream is converted into the data part 55 of 11 bits by combining the MSB. The reversing of the bit order in the combined data can prevent empty space in the table lookup's last part and can constitute a table lookup with an accurate number. Accordingly, the table lookup according to an embodiment of the present invention reduces an entire size of the table lookup by reversing the bit order.

Finally, the data 55 of 11 bits and the data 53 of the reaming 4 bits are combined to generate the data 56 of 15 bits. The final generated data 56 are used as an index of the table lookup.

The table lookup instruction TLD for loading a memory operates during two cycles. That is, the table lookup instruction TLD loads a table value after a table index is generated during a first cycle. Additionally, during a second cycle, the table lookup instruction TLD stores a code value (i.e., lower 24 bits of a loaded table value) in a data register dr, and increases a remainder rem through the upper 8 bits of a loaded table value.

Table 1 illustrates an operation of the table lookup instruction TLD.

TABLE 1

TLD dr, sr, (imm1) , imm2
; mem[index] <= sr + {LO(BS)[2], bs<31 − imm2: 31>},
LO(BS)[0:1]: cycle 1
; dr <= code(mem[index]) : cycle 2
; rc/rem <= rem+ length(mem[index1]): cycle 2

The table lookup instruction TLE converts data in the bit stream register into VLC during encoding through a table lookup and then transmits the converted data to a bit stream buffer. Accordingly, the remainder is increased by the length of the VLC.

The table lookup instruction TLE for loading a memory operates during two cycles. That is, the table lookup instruction TLE loads a table value after a table index is generated during a first cycle. Additionally, during a second cycle, the table lookup instruction TLE stores a code value (i.e., lower 24 bits of a loaded table value) in a bit stream register bs, and increases a remainder rem through the upper 8 bits of a loaded table value.

Table 2 illustrating an operation of the table lookup instruction TLE.

TABLE 2

TLE sr1, sr2
; mem[index] <= sr1 + sr2 : cycle 1
; bs <= code(mem[index]) : cycle 2
; carry/rem <= rem+length(mem[index1]) : cycle 2

The present invention includes LZS, LOS, REM, LBS, LBC, STS, and STC as a bit stream instruction. The bit stream instruction LZS reads a bit stream through the 31th register of the general purpose register 121 of FIG. 2 and then counts leading 0s.

Table 3 illustrates an operation of the table lookup instruction LZS.

TABLE 3

LZS dr, sr; dr <=leading0s(BS)
; carry/rem <= rem+leading0s(BS)

The bit stream instruction LOS reads a bit stream through the 31th register of the general purpose register 121 of FIG. 2 and then counts leading 1s.

Table 4 illustrates an operation of the table lookup instruction LOS.

TABLE 4

LOS dr, sr; dr <=leading1s(BS)
; carry/rem <= rem+leading0s(BS)

The bit stream instruction REM directly controls the remainder register rem if data of the bit stream are dumped without decoding. For example, the bit stream instruction REM performs byte align if sr[8] of the source register sr is 1 and performs 16 bit align if sr[9] of the source register sr is 1.

Table 5 illustrates an operation of the table lookup instruction REM.

TABLE 5

REM sr; carry/rem<5:0> <= rem<5:0>+sr<5:0>
(1) Byte align
REM[5:0]=(REM[2:0] ==)? REM[5:0]:REM[5:0]&6'b111000 +

TABLE 5-continued

6'b001000
(1) 16bit word align
REM[5:0]=(REM[3:0] ==0)? REM[5:0]:REM[5:0]&6'b110000 +
6'b0100000

The bit stream instruction LBS includes an auto-indexing function for effectively transmitting data from the bit stream buffer to the bit stream register during decoding. If all data in the bit stream register are used, the bit stream instruction LBC operates under a condition where the remainder carry is set in order to supply new data.

Table 6 illustrates operations of the table lookup instructions LBS and LBC.

TABLE 6

LBS sr, imm; bs <= mem[sr]; sr <= sr+imm
LBC sr, imm; if (RC), bs <=mem[sr]; sr <= sr+imm The bit stream instruction STS includes an auto-indexing function for effectively transmitting data from the bit stream register to the bit stream buffer. If all variable encoded data are written in the bit stream register, the bit stream instruction STC operates under a condition where carry (RC) of rem is set in order to supply new data.

Table 7 illustrates operations of the table lookup instructions STS and STC.

TABLE 7

STS sr, imm; mem[sr] <= bs; sr <= sr+imm
STC sr, imm; if (RC) mem[sr] <= bs; sr <= sr+imm Accordingly, the bit stream processor according to an embodiment of the present invention reduces an entire table size by using a table prefix that counts 0s, such that an entire memory size using a table can be reduced. Additionally, by using an exclusive instruction for a bit stream, variable data of a continuous bit stream can be efficiently processed.

During the variable data processing process of a bit stream, it can be accomplished with a simple structure using a table lookup and an exclusive instruction for a bit stream. Therefore, an operating speed can be improved by designing with a pipelined architecture.

According to the present invention, the size of a table lookup is reduced by applying a value that counts the number of 0s.

Additionally, variable data of a bit stream are efficiently processed using an exclusive instruction of a bit stream.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:
1. A method of operating a bit stream processor that processes a bit stream through a table lookup, the bit stream including a first data part and a second data part, the method comprising:
counting the number of 0s or 1s in the first data part to get a counted result;

combining the counted result with the second data part to get a combined result; and reversing a bit order, except for the most significant bit, of the combined result.

2. The method of claim 1, wherein the counted result is a table prefix of the table lookup.

3. The method of claim 1, wherein the bit stream is processed in groups of 4 bits.

4. The method of claim 1, wherein the counted result comprises 3 bits.

5. The method of claim 1, wherein the combined result is used as an index of the table lookup.

6. A method of operating a bit stream processor using a bit stream having first and second data parts, the method comprising:

Obtaining a counted result by counting the number of 0s or 1s in the first data part;

calculating a combined result by combining the counted result with the second data part; and reversing a bit order of the combined result.

* * * * *